(12) United States Patent
Tanaka

(10) Patent No.: US 10,328,697 B2
(45) Date of Patent: Jun. 25, 2019

(54) ELECTRONIC DEVICE

(71) Applicant: Seiko Epson Corporation, Tokyo (JP)

(72) Inventor: Shuichi Tanaka, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/541,247

(22) PCT Filed: Mar. 10, 2016

(86) PCT No.: PCT/JP2016/001360
§ 371 (c)(1),
(2) Date: Jun. 30, 2017

(87) PCT Pub. No.: WO2016/143355
PCT Pub. Date: Sep. 15, 2016

(65) Prior Publication Data
US 2017/0368825 A1    Dec. 28, 2017

(30) Foreign Application Priority Data

Mar. 10, 2015 (JP) .................................. 2015-046945

(51) Int. Cl.
*B41J 2/14*      (2006.01)
*H01L 41/047*    (2006.01)
(Continued)

(52) U.S. Cl.
CPC ...... *B41J 2/14233* (2013.01); *H01L 41/0472* (2013.01); *B41J 2002/14491* (2013.01);
(Continued)

(58) Field of Classification Search
CPC ................ B41J 2/14233; B41J 2202/18; B41J 2002/14491; H01L 41/0472
See application file for complete search history.

(56) References Cited

U.S. PATENT DOCUMENTS 8,613,499 B2    12/2013  Miyazawa
9,889,655 B2 *   2/2018  Tanaka ................. B41J 2/14233
(Continued)

FOREIGN PATENT DOCUMENTS

EP    0289347 A2    11/1988
EP    2803486 A1    11/2014
(Continued)

OTHER PUBLICATIONS

International Search Report from PCT/JP2016/001360 dated Sep. 15, 2016. (3 Pages).

*Primary Examiner* — Lamson D Nguyen
(74) *Attorney, Agent, or Firm* — Workman Nydegger

(57) ABSTRACT

Provided is an electronic device in which penetrating wires can be formed easily. The electronic device includes a sealing plate 33 having a first surface 41 to which a pressure chamber-forming plate 29 is connected and a second surface 42 which is on a side opposite from the first surface 41 and on which a drive IC 34 is provided; bump electrodes 40 which are arranged in a nozzle row direction on the first surface 41 of the sealing plate 33 and which output signals to piezoelectric elements 32; individual connection terminals 54 which are arranged in the nozzle row direction on the second surface 42 of the sealing plate 33 and to which the signals are inputted, wherein wires each of which connects one of the bump electrodes 40 to one of the individual connection terminals 54 corresponding to the bump electrode 40 each include a penetrating wire 45 formed inside a through hole 45*a* penetrating the sealing plate 33 and made of a conductor, the penetrating wires 45 are formed at positions away from the bump electrodes 40 or the individual connection terminals 54 in a direction perpendicular to the nozzle row direction, and each two of the penetrating wires 45 adjacent in the nozzle row direction are arranged at (Continued)

different positions in the direction perpendicular to the nozzle row direction.

5 Claims, 5 Drawing Sheets

(51) Int. Cl.
    *H01L 41/053*     (2006.01)
    *H01L 41/29*     (2013.01)

(52) U.S. Cl.
    CPC ....... *B41J 2202/18* (2013.01); *H01L 41/0533* (2013.01); *H01L 41/29* (2013.01)

(56) References Cited

U.S. PATENT DOCUMENTS

| | | |
|---|---|---|
| 2006/0012649 A1 | 1/2006 | Sakaida |
| 2007/0024676 A1 | 2/2007 | Kachi |
| 2007/0063206 A1 | 3/2007 | Maeda |
| 2007/0211108 A1 | 9/2007 | Enomoto et al. |
| 2013/0016161 A1 | 1/2013 | Hotta |
| 2013/0120504 A1 | 5/2013 | Yanata et al. |

FOREIGN PATENT DOCUMENTS

| | | |
|---|---|---|
| JP | 2006-192685 | 7/2006 |
| JP | 2012-051253 | 3/2012 |
| JP | 2013-018197 A | 1/2013 |
| JP | 2014-226790 A | 12/2014 |
| WO | 2011/068006 A1 | 6/2011 |

\* cited by examiner

[Fig. 1]
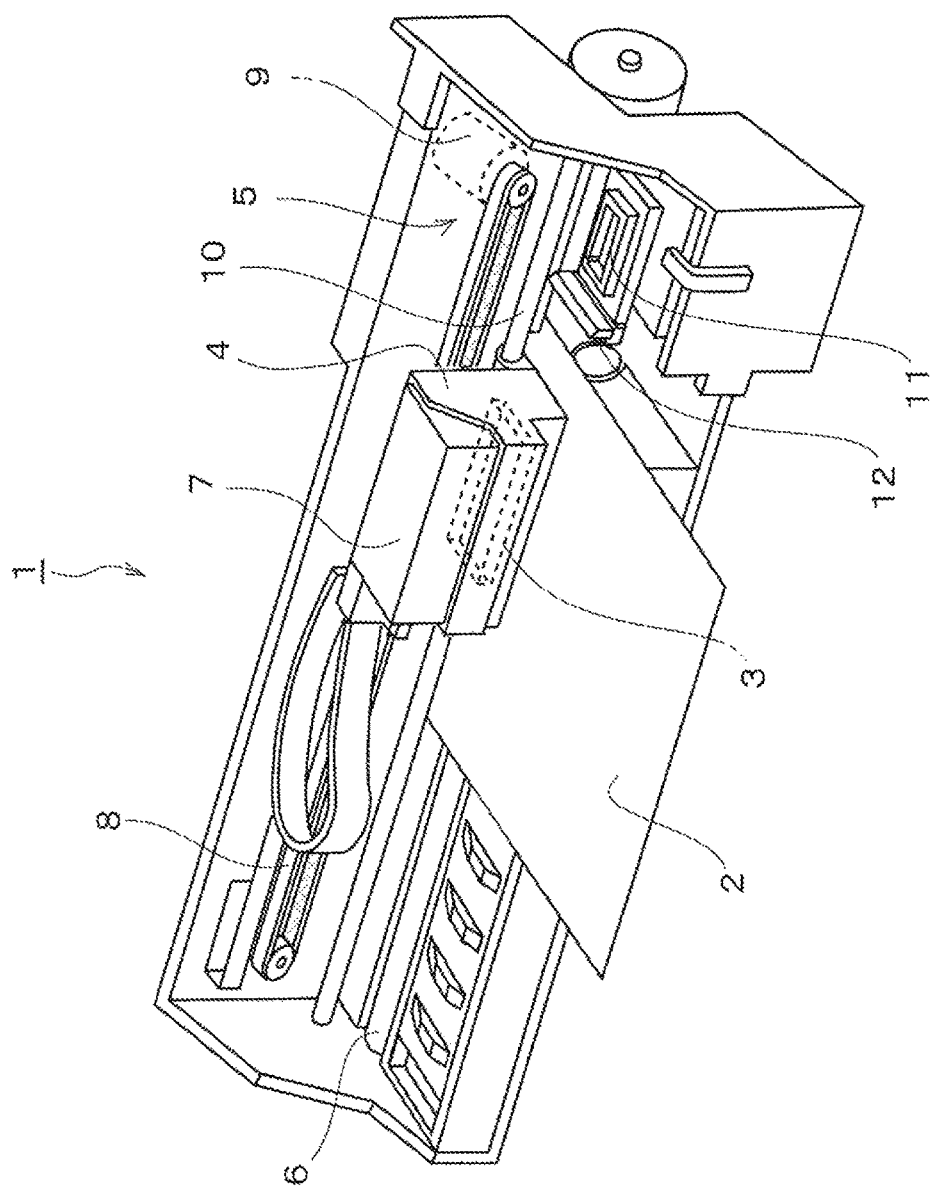

[Fig. 2]
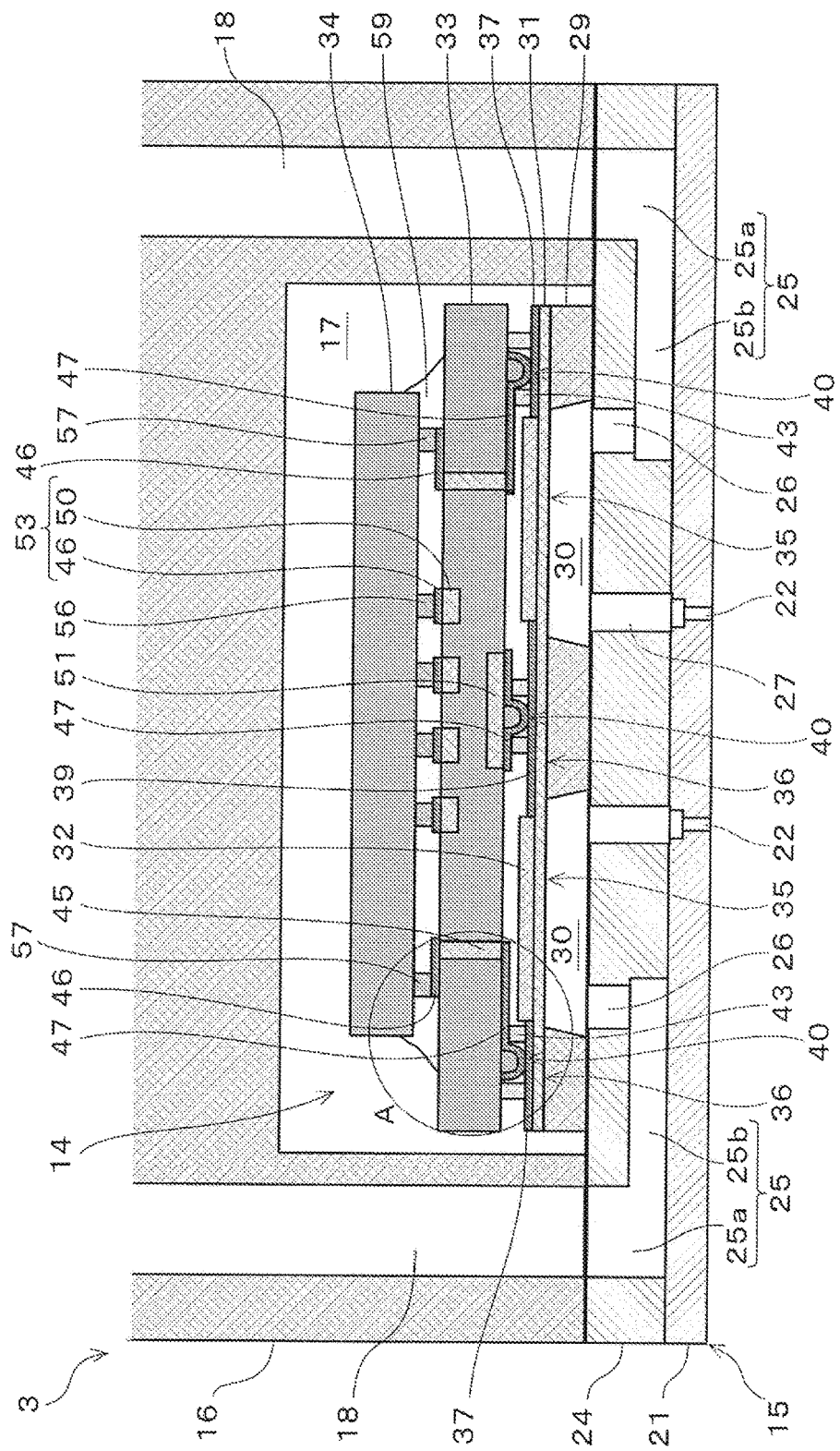

[Fig. 3]
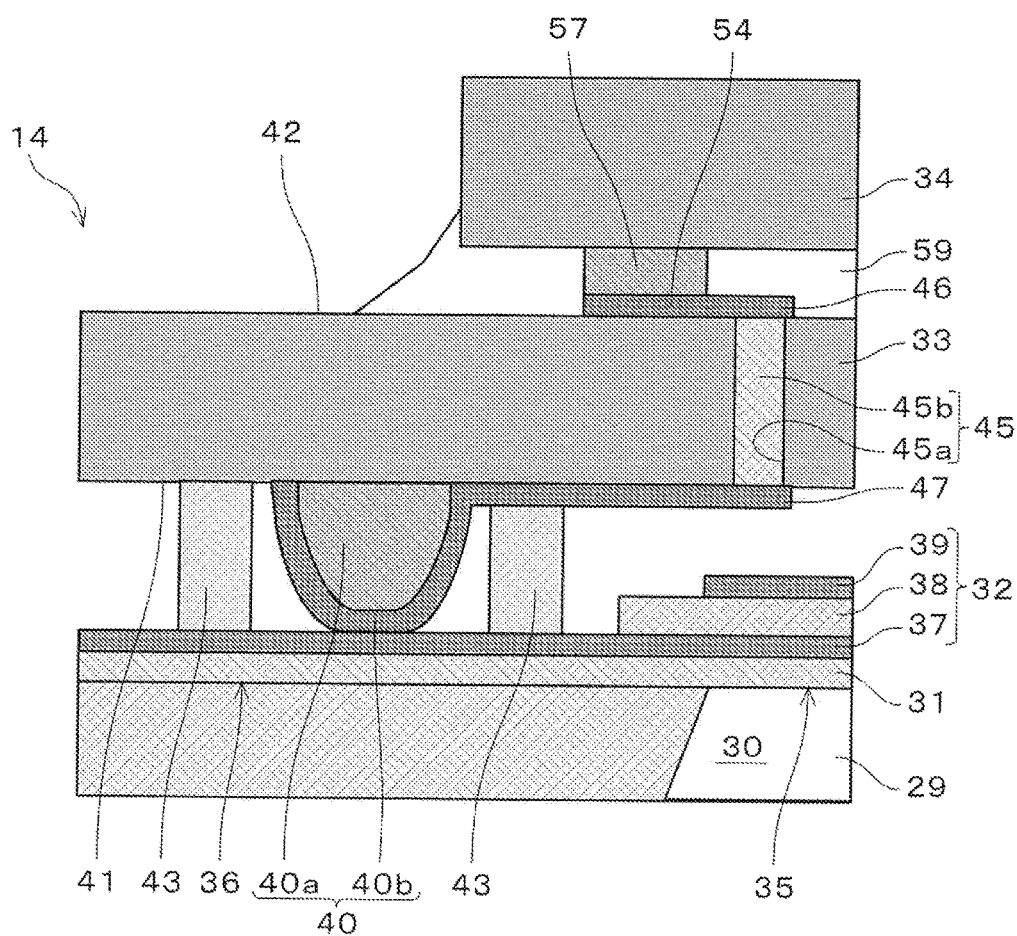

[Fig. 4]
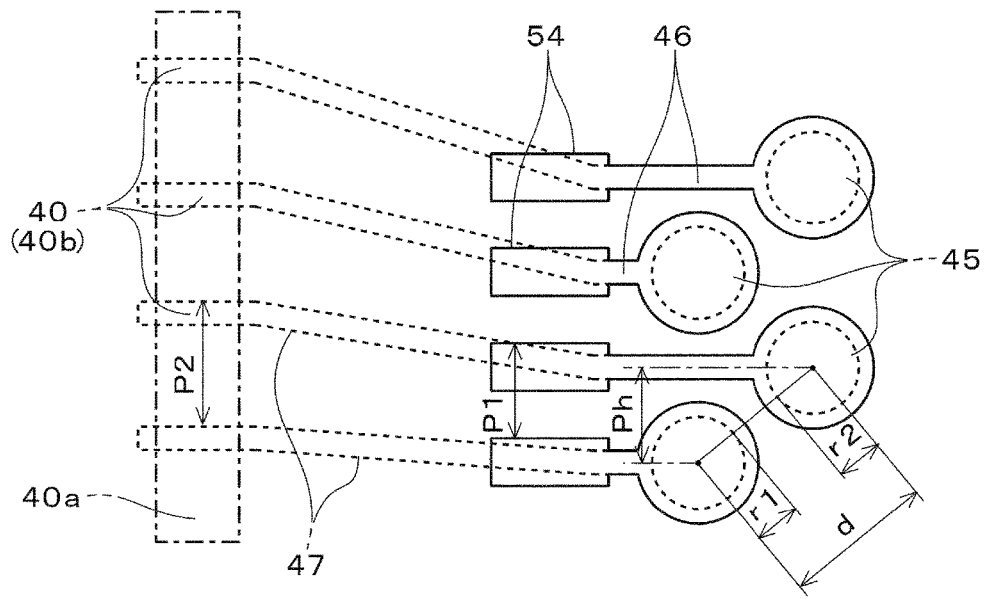
[Fig. 5]
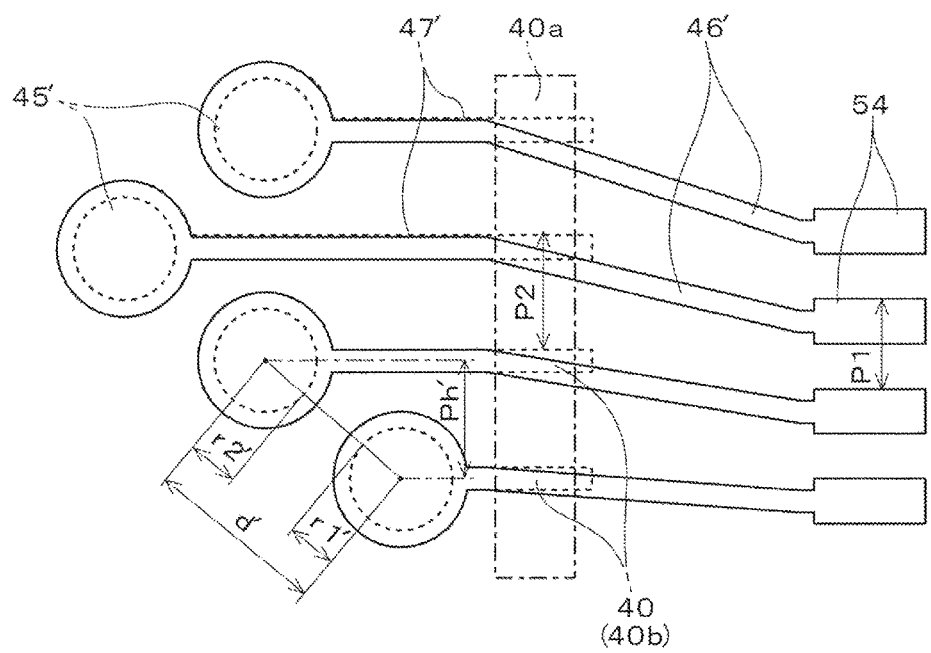

[Fig. 6A]
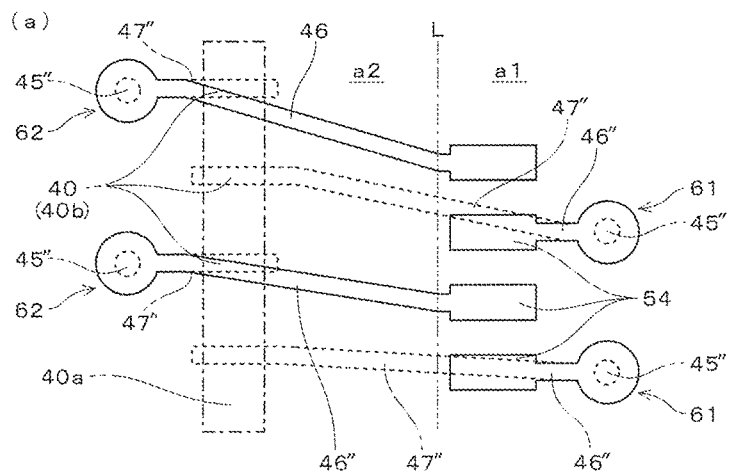
[Fig. 6B]
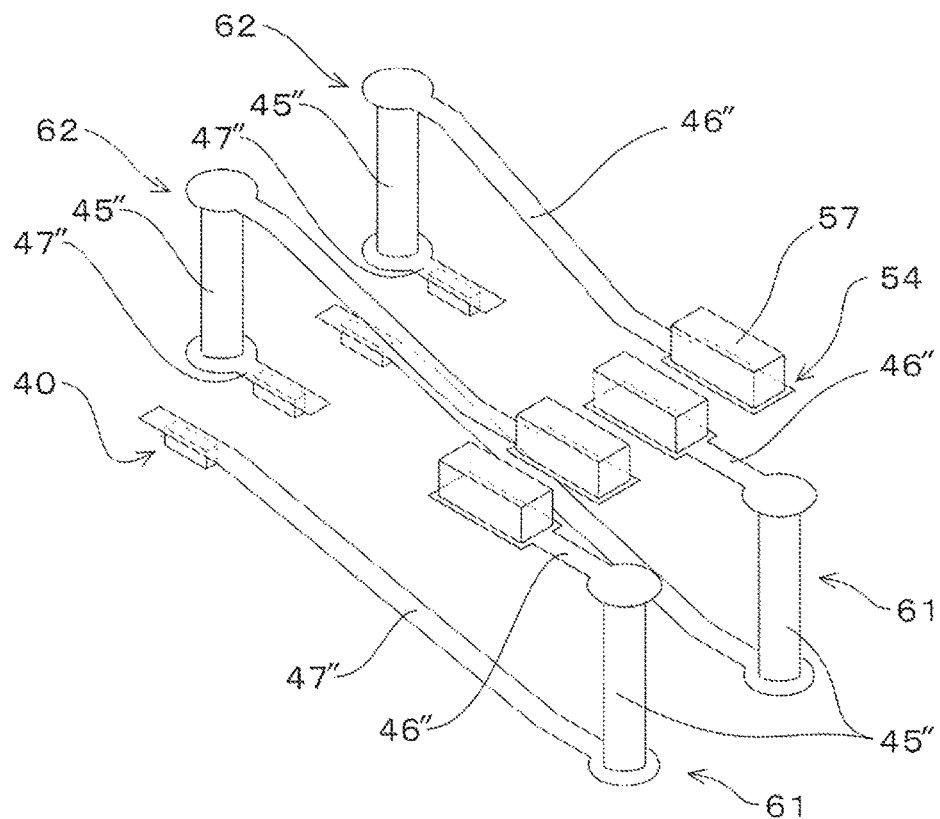

ELECTRONIC DEVICE

TECHNICAL FIELD

The present invention relates to an electronic device including a wiring plate in which wires are formed.

BACKGROUND ART

Some electronic devices provided with driving elements such as piezoelectric elements that deform upon application of voltage are applied to various apparatuses, sensors, and the like. For example, in the case of liquid jetting devices, various types of liquids are jetted through liquid jetting heads utilizing electronic devices. Examples of the liquid jetting devices include image recording devices such as inkjet-type printers and inkjet-type plotters. Recently, liquid jetting devices have been applied also to various manufacturing devices by taking such an advantage that extremely small amounts of liquid can be landed precisely on predetermined positions. For example, liquid jetting devices have been applied to display manufacturing devices for manufacturing color filters of liquid crystal displays and the like, electrode forming devices for forming electrodes of organic electro luminescence (EL) displays, surface emission displays (FEDs), and the like, and chip manufacturing devices for manufacturing biochips (biochemical elements). Here, a recording head of an image recording device jets liquid ink, and a coloring material jetting head for a display manufacturing device jets solutions of coloring materials of R (Red), G (Green), or B (Blue). Meanwhile, an electrode material jetting head for an electrode forming device jets a liquid electrode material, and a bioorganic matter jetting head for a chip manufacturing device jets a solution of bioorganic matter.

Each of the above-described liquid jetting heads includes an electronic device in which a pressure chamber-forming plate, piezoelectric elements (a type of driving element), a sealing plate, and the like are stacked on each other. Here, pressure chambers communicating with nozzles are formed in the pressure chamber-forming plate, and the piezoelectric elements cause change in pressure of the liquid in the pressure chambers. In addition, the sealing plate is arranged with a space provided between the sealing plate and the piezoelectric elements. The above-described piezo-electric elements are driven by drive signals supplied by a drive IC (also referred to as a driver IC). This drive IC is provided outside the electronic device in related art. For example, a drive IC provided to a tape carrier package (TCP) connected to an electronic device is known (for example, see PTL 1). Here, drive signals from the drive IC are supplied to the piezoelectric elements through wiring formed in the TCP.

With the recent size reduction of liquid jetting head, a technology has been developed by which a drive IC is joined onto a sealing plate covering piezoelectric elements. In this configuration, multiple terminals to be joined to terminals of the drive IC are formed on a surface on one side (drive IC side) of the sealing plate. Meanwhile, multiple terminals to be connected to terminals of the piezoelectric elements are formed on a surface on the other side (on the side opposite from the drive IC side) of the sealing plate. In addition, the terminals formed on the surface on the one side are connected to the terminals formed on the surface on the other side by wires including penetrating wires. Here, each penetrating wire is a wire made of a conductor wired inside a through hole penetrating the wiring plate. The penetrating wire provides connection between the surface on the one side and the surface on the other side of the wiring plate.

SUMMARY OF INVENTION

Technical Problem

Here, the recent increase in density of nozzles has caused a trend toward a shorter distance (narrower pitch) between centers of adjacent terminals. As the pitch of the terminals becomes narrower, the distance between the wires that connect one terminal to another terminal also becomes narrower. This may cause interference between adjacent penetrating wires, i.e., adjacent through holes. It is conceivable that smaller through holes may be formed to avoid the interference between the through holes. However, this increases the ratio (so-called aspect ratio) of the plate thickness of the wiring plate to the diameter (hole diameter) of each through hole, making it difficult to form the wires inside the through holes.

The invention has been made in view of such circumstances, and an object of the invention is to provide an electronic device in which penetrating wires can be formed easily.

Solution to Problem

An electronic device of the invention is proposed to achieve the above-described object, which includes:

a wiring plate having a first surface to which a driving element-forming plate including multiple driving elements is connected and a second surface which is on a side opposite from the first surface and on which a drive IC that outputs signals for driving the driving elements is provided;

multiple first terminals which are arranged in a first direction on the first surface of the wiring plate and which output the signals to the driving elements; and multiple second terminals which are arranged in the first direction on the second surface of the wiring plate and to which the signals are inputted, wherein wires each of which connects one of the first terminals to one of the second terminals corresponding to the first terminal each include a penetrating wire formed inside a through hole penetrating the wiring plate and made of a conductor, each of the penetrating wires is formed at a position away from the first terminal or the second terminal in a second direction perpendicular to the first direction, and each two of the penetrating wires adjacent in the first direction are arranged at different positions in the second direction.

With this configuration, each two of the penetrating wires adjacent in the first direction are arranged at different positions in the second direction. Hence, the through holes can have larger diameters (larger hole diameters). This makes it possible to lower the ratio (so-called aspect ratio) of the plate thickness of the wiring plate to the diameter of each of the through holes, without changing the plate thickness of the wiring plate, so that a conductor can be easily formed in the through holes by a method such as an electrolytic plating method. Consequently, the electronic device can be manufactured at low costs.

In addition, in the above-described configuration, a distance between centers of each two of the through holes adjacent in the first direction is preferably larger than a sum of radii of the two through holes.

With this configuration, a short circuit between each two of the penetrating wires adjacent in first direction can be suppressed more surely.

Moreover, in the above-described configuration, a distance in the first direction between the centers of the two through holes adjacent in the first direction is preferably smaller than the sum of the radii of the two through holes.

With this configuration, a pitch of the first terminals or the second terminals connected to the penetrating wires by wires formed to extend in the second direction can be finer. This makes it possible to reduce the size of the wiring plate and, in turn, achieve size reduction of the electronic device.

BRIEF DESCRIPTION OF DRAWINGS

FIG. 1 is a perspective view for describing a configuration of a printer.

FIG. 2 is a cross-sectional view for describing a configuration of a recording head.

FIG. 3 is an enlarged cross-sectional view of a main portion of an electronic device.

FIG. 4 is a plan view of a sealing plate.

FIG. 5 is a plan view of a wiring plate of a second embodiment.

FIG. 6A shows a view for describing a wiring plate of a third embodiment, where FIG. 6A is a plan view of the wiring plate.

FIG. 6B shows a view for describing a wiring plate of a third embodiment, where FIG. 6B is a perspective view for describing structures of wires.

DESCRIPTION OF EMBODIMENTS

Hereinafter, embodiments for carrying out the invention are described with reference to the attached drawings. Note that, in the embodiments described below, various limitations are provided as specific preferred examples of the invention. However, the scope of the invention is not limited to any of these embodiments, unless it is stated that the invention is limited to the embodiment in the description below. In addition, an inkjet-type printer (hereinafter, printer), which is a type of liquid jetting device, on which an inkjet-type recording head (hereinafter, recording head), which is a type of liquid jetting head, including an electronic device according to the invention is mounted is taken as an example in the following description.

A configuration of a printer 1 is described with reference to FIG. 1. The printer 1 is a device that jets ink (a type of liquid) onto a surface of a recording medium 2 (a type of landing target) such as recording paper to record an image or the like. This printer 1 includes a recording head 3, a carriage 4 to which the recording head 3 is attached, a carriage-moving mechanism 5 that moves the carriage 4 in a main scanning direction, a transfer mechanism 6 that transports the recording medium 2 in a sub-scanning direction, etc. Here, the ink is stored in an ink cartridge 7 serving as a liquid supply source. The ink cartridge 7 is detachably mounted on the recording head 3. Note that it is also possible to employ a configuration in which the ink cartridge is disposed on a main body side of the printer, and the ink is supplied from the ink cartridge through an ink supply tube to the recording head.

The carriage-moving mechanism 5 includes a timing belt 8. The timing belt 8 is driven by a pulse motor 9 such as a DC motor. Accordingly, when the pulse motor 9 is actuated, the carriage 4 reciprocates in the main scanning direction (a width direction of the recording medium 2), while being guided by a guide rod 10 provided across the printer 1. The position of the carriage 4 in the main scanning direction is detected by a linear encoder (not-illustrated), which is a type of positional information detector. The linear encoder transmits a detected signal, i.e., an encoder pulse (a type of positional information) to a control unit of the printer 1.

In addition, a home position serving as a starting point of the scanning by the carriage 4 is set in an end portion region outside a recording region within which the carriage 4 can move. In the home position, a cap 11 that seals nozzles 22 formed on a nozzle surface (nozzle plate 21) of the recording head 3 and a wiping unit 12 that wipes out the nozzle surface are arranged in this order from the end portion side.

Next, the recording head 3 is described. FIG. 2 is a cross-sectional view for describing a configuration of the recording head 3. FIG. 3 is an enlarged view of the region A in FIG. 2 and specifically is an enlarged cross-sectional view of a main portion of an electronic device 14 integrated in the recording head 3. As shown in FIG. 2, the recording head 3 in this embodiment is attached to a head case 16, with the electronic device 14 and a flow path unit 15 stacked together. Note that, for convenience, a direction in which the members are stacked is taken as a vertical direction in the description.

The head case 16 is a box-shaped member made of a synthetic resin. Reservoirs 18 from which ink is supplied to pressure chambers 30 are formed inside the head case 16. The reservoirs 18 are spaces in which ink common to the multiple pressure chambers 30 arranged side by side is stored, and the number of the reservoirs 18 formed is two, which is equal to the number of the rows of the pressure chambers 30, which are arranged side by side in two rows. Note that, in an upper portion of the head case 16, ink introducing paths (not-illustrated) are formed through which the ink from the ink cartridge 7 is introduced into the reservoirs 18. In addition, on a lower surface side of the head case 16, a housing space 17 is formed which is recessed into a cuboid shape from the lower surface to a certain midpoint of the head case 16 in a height direction. When the flow path unit 15 described later is joined to a lower surface of the head case 16 with the flow path unit 15 and the head case 16 positioned with respect to each other, the electronic device 14 (a pressure chamber-forming plate 29, a sealing plate 33, and the like) stacked on a communicating plate 24 is housed in the housing space 17 in this configuration.

The flow path unit 15 joined to the lower surface of the head case 16 includes the communicating plate 24 and the nozzle plate 21. The communicating plate 24 is a plate member made of silicon. In this embodiment, the communicating plate 24 is made of a single crystal silicon substrate with the crystal plane orientation on each surface (upper surface and lower surface) being (110) plane. In this communicating plate 24, as shown in FIG. 2, common liquid chambers 25 and individual communicating paths 26 are formed by etching. The common liquid chambers 25 communicate with the reservoirs 18 and store ink common to the pressure chambers 30. The individual communicating paths 26 supply the ink from the reservoirs 18 through the common liquid chambers 25 individually to the pressure chambers 30. The common liquid chambers 25 are space portions elongated in a nozzle row direction (equivalent to a first direction in the invention), and are formed in two rows corresponding to the rows of the pressure chambers 30 arranged side by side in the two rows. Each of the common liquid chambers 25 includes a first liquid chamber 25a penetrating the communicating plate 24 in a plate thickness direction thereof, and a second liquid chamber 25b formed by recessing the communicating plate 24 from the lower surface side toward the upper surface side of the communicating plate 24 to a certain midpoint of the communicating plate 24 in the plate thickness direction, with a thin plate portion left on the upper surface side. The multiple individual communicating paths 26 corresponding to the pressure chambers 30 are formed in the thin plate portion of the second liquid chamber 25b, while being arranged in a direction in which the pressure chambers 30 are arranged side by side. When the communicating plate 24 and the pressure chamber-forming plate 29 are joined to each other, each of the individual communicating paths 26 communicates with an end portion of a corresponding one of the pressure chambers 30 on one side in a longitudinal direction of the pressure chamber 30.

In addition, a nozzle communicating path 27 that penetrates the communicating plate 24 in the plate thickness direction is formed at a position in the communicating plate 24 corresponding to each of the nozzles 22. In other words, multiple nozzle communicating paths 27 corresponding to each of the nozzle rows are formed in the nozzle row direction. Through the nozzle communicating paths 27, the pressure chambers 30 and the nozzles 22 communicate with each other. When the communicating plate 24 and the pressure chamber-forming plate 29 are joined to each other, each of the nozzle communicating paths 27 of this embodiment communicates with an end portion of the corresponding one of the pressure chambers 30 on the other side (on a side opposite from the individual communicating path 26) in the longitudinal direction.

The nozzle plate 21 is a silicon plate (for example, a single crystal silicon substrate) joined to a lower surface (a surface on a side opposite from the pressure chamber-forming plate 29) of the communicating plate 24. In this embodiment, this nozzle plate 21 seals openings of spaces on a lower surface side serving as the common liquid chambers 25. In addition, in the nozzle plate 21, the multiple nozzles 22 are opened on straight lines (in rows). In this embodiment, two nozzle rows are formed corresponding to the rows of the pressure chambers 30 formed in the two rows. The multiple nozzles 22 arranged side by side (nozzle rows) are provided at regular intervals in the sub-scanning direction perpendicular to the main scanning direction from one of the nozzles 22 on one end side to one of the nozzles 22 on another end side with a pitch (for example, 600 dpi) corresponding to a dot formation density. Note that it is also possible to join the nozzle plate to a region of the communicating plate inside the common liquid chambers, and seal openings on the lower surface side of the spaces to form the common liquid chambers with, for example, flexible members such as compliance sheets. With this configuration, the nozzle plate can be made as small as possible.

The electronic device 14 of this embodiment is a thin plate-shaped device functioning as an actuator that causes change in pressure of the ink in each of the pressure chambers 30. As shown in FIGS. 2 and 3, the pressure chamber-forming plate 29, a vibration plate 31, piezoelectric elements 32 (equivalent to driving elements according to the invention), the sealing plate 33, and a drive IC 34 are stacked together and unitized into the electronic device 14. Note that the electronic device 14 is formed to be smaller than the housing space 17, so that the electronic device 14 can be housed in the housing space 17.

The pressure chamber-forming plate 29 is a hard plate member made of silicon. In this embodiment, the pressure chamber-forming plate 29 is made of a single crystal silicon substrate with the crystal plane orientation on each surface (upper surface and lower surface) being (110) plane. Some portions of the pressure chamber-forming plate 29 are removed by etching completely in the plate thickness direction to form multiple spaces to serve the pressure chambers 30 arranged side by side in the nozzle row direction. A lower portion of each of the spaces is defined by the communicating plate 24, and an upper portion of each of the spaces is defined by the vibration plate 31. In this manner, the spaces constitute the pressure chambers 30. In addition, the spaces, i.e., the pressure chambers 30 are formed in two rows corresponding to the rows of the nozzles formed in the two rows. Each of the pressure chambers 30 is a space portion elongated in a direction (equivalent to a second direction according to the invention) perpendicular to the nozzle row direction. An end portion of the pressure chamber 30 on one side in the longitudinal direction communicates with the individual communicating path 26, and an end portion on the other side communicates with the nozzle communicating path 27.

The vibration plate 31 is a thin film-shaped elastic member, and is stacked on an upper surface (a surface on a side opposite from the communicating plate 24) of the pressure chamber-forming plate 29. The vibration plate 31 seals upper openings of the spaces to serve as the pressure chambers 30. In other words, the vibration plate 31 defines the pressure chambers 30. Portions in the vibration plate 31 corresponding to the pressure chambers 30 (specifically, the upper openings of the pressure chambers 30) function as displacement portions that are displaced in a direction leaving from the nozzles 22 or in a direction approaching the nozzles 22 with the flexural deformation of the piezoelectric elements 32. In other words, regions in the vibration plate 31 corresponding to the upper openings of the pressure chambers 30 serve as drive regions 35 where the flexural deformation is allowed. On the other hand, regions in the vibration plate 31 not on the upper openings of the pressure chambers 30 serve as non-drive regions 36 where the flexural deformation is inhibited.

Note that the vibration plate 31 includes, for example, an elastic film formed on an upper surface of the pressure chamber-forming plate 29 and made of silicon dioxide ($SiO_2$), and an insulation film formed on the elastic film and made of zirconium oxide ($ZrO_2$). In addition, each of the piezoelectric elements 32 is stacked on the insulation film (on a surface of the vibration plate 31 on the side opposite from the pressure chamber-forming plate 29) and in a region corresponding to the corresponding one of the pressure chambers 30, i.e., in the drive region 35. The piezoelectric elements 32 are formed in two rows extending in the nozzle row direction so as to correspond to the two rows of the pressure chambers 30 arranged side by side in the nozzle row direction. Note that the pressure chamber-forming plate 29 and the vibration plate 31 stacked on the pressure chamber-forming plate 29 are equivalent to a driving element-forming plate according to the invention.

Each of the piezoelectric elements 32 of this embodiment is a piezoelectric element of a so-called flexural mode. As shown in FIG. 3, the piezoelectric element 32 includes, for example, a lower electrode layer 37 (individual electrode), a piezoelectric layer 38, and an upper electrode layer 39 (common electrode) sequentially stacked on the vibration plate 31. When an electric field is applied across the lower electrode layer 37 and the upper electrode layer 39 according to the potential difference between the electrodes, the thus configured piezoelectric element 32 undergoes flexural deformation in the direction leaving from or approaching the nozzle 22. As shown in FIG. 3, an end portion of the lower electrode layer 37 on another side (on an outside in the longitudinal direction of the piezoelectric element 32) is provided to extend to one of the non-drive regions 36 from the drive regions 35 beyond the region where the piezoelectric layer 38 is stacked. On the other hand, as shown in FIG. 2, an end portion of the upper electrode layer 39 on one side (on an inside in the longitudinal direction of the piezoelectric element 32) is provided to extend to another of the non-drive regions 36 located between the rows of the piezoelectric elements 32 from the drive region 35 beyond the region where the piezoelectric layer 38 is stacked. In other words, in the longitudinal direction of the pressure chambers 30, the upper electrode layer 39 is formed to extend to the non-drive region 36 on the one side, whereas the lower electrode layer 37 is formed to extend to the non-drive region 36 on the other side. In addition, bump electrodes 40 (described later) are joined correspondingly to the lower electrode layer 37 and the upper electrode layer 39, which are formed to extend as described above. Note that, in this embodiment, the upper electrode layer 39 extending from the row of the piezoelectric elements 32 on one side and the upper electrode layer 39 extending from the row of the piezoelectric elements 32 on the other side are connected to each other in the non-drive region 36 between the rows of the piezo-electric elements 32. In other words, the upper electrode layer 39 common to the piezo-electric elements 32 on both sides is formed in the non-drive region 36 between the rows of the piezoelectric elements 32.

As shown in FIGS. 2 and 3, the sealing plate 33 (equivalent to a wiring plate according to the invention) is a flat-plate shaped silicon plate arranged with a space provided between the sealing plate 33 and the vibration plate 31 (or the piezoelectric element 32). In this embodiment, the sealing plate 33 is formed of a single crystal silicon substrate with crystal plane orientation on each surface (upper surface and lower surfaces) being (110) plane. On a second surface 42 (upper surface) of the sealing plate 33 on a side opposite from a first surface 41 (lower surface), which is a surface on the vibration plate 31 side, a drive IC 34 that outputs signals for driving the piezoelectric elements 32 is arranged. In other words, the vibration plate 31 on which the piezoelectric elements 32 are stacked is connected to the first surface 41 of the sealing plate 33, whereas the drive IC 34 is provided on the second surface 42 of the sealing plate 33.

On the first surface 41 of the sealing plate 33 in this embodiment, the multiple bump electrodes 40 that output drive signals from the drive IC 34 and the like to the piezo-electric elements 32 are formed. As shown in FIG. 2, multiple bump electrodes 40 are formed in the nozzle row direction at each of a position corresponding to the lower electrode layers 37 (individual electrode) formed to extend to the outside of the piezo-electric elements 32 on one side, a position corresponding to the lower electrode layers 37 (individual electrode) formed to extend to the outside of the piezoelectric elements 32 on the other side, and a position corresponding to the upper electrode layer 39 (common electrode) which is formed between the two rows of the piezoelectric elements 32 and which is common to the multiple piezoelectric elements 32. In addition, each of the bump electrodes 40 is connected to a corresponding one of the lower electrode layers 37 and to the upper electrode layer 39.

In this embodiment, each of the bump electrodes 40 has elasticity, and protrudes from the surface of the sealing plate 33 toward the vibration plate 31. Specifically, as shown in FIG. 3, the bump electrode 40 includes an inner resin 40a having elasticity and a conductive film 40b including a lower surface-side wire 47 (described later) covering at least part of a surface of the inner resin 40a. The inner resin 40a is formed on the surface of the sealing plate 33 like a protrusion elongated in the nozzle row direction. In addition, the multiple conductive films 40b electrically connected to the lower electrode layers 37 (individual electrodes) are formed to extend in the nozzle row direction so as to correspond to the piezoelectric elements 32 arranged side by side in the nozzle row direction. In other words, multiple bump electrodes 40 electrically connected to the lower electrode layers 37 are formed in the nozzle row direction. Each of the conductive films 40b extends inwardly from a portion on the inner resin 40a (toward the piezoelectric element 32) to form the lower surface-side wire 47. In addition, an end portion of the lower surface-side wire 47 on a side opposite from the bump electrode 40 is connected to a penetrating wire 45 described later. Note that the bump electrodes 40 are equivalent to first terminals according to the invention.

As shown in FIG. 2, the multiple bump electrodes 40 corresponding to the upper electrode layer 39 of this embodiment are formed on a lower surface-side embedded wire 51 embedded in the first surface 41 of the sealing plate 33. Specifically, on the lower surface-side embedded wire 51 formed to extend in the nozzle row direction, the inner resin 40a having a narrower width (dimension in the direction perpendicular to the nozzle row direction) than a width of the lower surface-side embedded wire 51 is formed to extend in the nozzle row direction. In addition, the conductive films 40b are formed to be spread from a portion on the inner resin 40a to both sides of the inner resin 40a in the width direction so as to be electrically connected to the lower surface-side embedded wire 51. The multiple conductive films 40b are formed in the nozzle row direction. In other words, the multiple bump electrodes 40 electrically connected to the upper electrode layer 39 are formed in the nozzle row direction. Note that, the inner resin 40a used is, for example, a resin such as a polyimide resin.

As shown in FIG. 2, the sealing plate 33 and the pressure chamber-forming plate 29 (specifically, the pressure chamber-forming plate 29 on which the vibration plate 31 and the piezoelectric elements 32 are stacked) are joined to each other by a photo-sensitive adhesive agent 43 having both thermosetting and photosensitive characteristics, with the bump electrodes 40 interposed therebetween. In this embodiment, pieces of the photosensitive adhesive agent 43 are formed on both sides of each of the bump electrodes 40 in the direction perpendicular to the nozzle row direction. In addition, the pieces of the photosensitive adhesive agent 43 are formed like bands extending in the nozzle row direction, while being away from the bump electrodes 40. Note that, as the photosensitive adhesive agent 43, for example, a resin mainly containing an epoxy resin, an acrylic resin, a phenolic resin, a polyimide resin, a silicone resin, a styrene resin, or the like is preferably used.

In addition, as shown in FIG. 2, multiple power supply wires 53 (four wires in this embodiment) are formed on the second surface 42 in a center portion of the sealing plate 33. The power supply wires 53 supply power voltages and the like (for example, VDD1 (power supply of a low-voltage circuit), VDD2 (power supply of a high-voltage circuit), VSS1 (power supply of a low-voltage circuit), and VSS2 (power supply of a high-voltage circuit)) to the drive IC 34. Each of the power supply wires 53 includes an upper surface-side embedded wire 50 embedded in the second surface 42 of the sealing plate 33, and an upper surface-side wire 46 stacked to cover the upper surface-side embedded wire 50. A corresponding power supply terminal 56 of the drive IC 34 is electrically connected onto the upper surface-side wire 46 of the power supply wire 53. Note that each of the lower surface-side embedded wire 51 and the upper surface-side embedded wire 50 is made of a metal such as copper (Cu). Moreover, as shown in FIG. 3, an individual connection terminal 54 (equivalent to a second terminal according to the invention) to which an individual terminal 57 of the drive IC 34 is connected and to which a signal is inputted from the drive IC 34 is formed in a region on each of both end sides of the second surface 42 of the sealing plate 33 (each region outside the region where the power supply wires 53 are formed). The upper surface-side wire 46 is provided to extend inwardly (toward the piezoelectric element 32) from each of the individual connection terminals 54. In addition, an end portion of the upper surface-side wire 46 on a side opposite from the individual connection terminal 54 is connected to the corresponding one of the lower surface-side wires 47 through a penetrating wire 45 described later.

The penetrating wire 45 is a wire that provides connection between the first surface 41 and the second surface 42 of the sealing plate 33. The penetrating wire 45 includes a through hole 45a penetrating the sealing plate 33 in the plate thickness direction and a conductor portion 45b formed inside the through hole 45a and made of a conductor such as a metal. The conductor portion 45b of this embodiment is made of a metal such as copper (Cu), and filled in the through hole 45a. A portion of the conductor portion 45b exposed in an opening portion of the through hole 45a on the first surface 41 side is covered with the corresponding one of the lower surface-side wires 47. On the other hand, a portion of the conductor portion 45b exposed to another opening portion of the through hole 45a on the second surface 42 side is covered with the corresponding one of the upper surface-side wires 46. Hence, the penetrating wire 45 electrically connects the upper surface-side wire 46 provided to extend from the individual connection terminal 54 and the lower surface-side wire 47 formed to extend from the corresponding one of the bump electrodes 40 to each other. In other words, the series of wires including the upper surface-side wire 46, the penetrating wire 45, and the lower surface-side wire 47 connects the individual connection terminal 54 and the bump electrode 40 to each other. Note that the conductor portion 45b of the penetrating wire 45 does not necessarily have to be filled in the through hole 45a, but may be formed in at least part of the through hole 45a. In addition, details of the configuration of the wiring groups that connect the individual connection terminals 54 to the bump electrodes 40 are described later.

The drive IC 34 is an IC chip that drives the piezoelectric elements 32, and is stacked on the second surface 42 of the sealing plate 33 with an adhesive agent 59 such as an anisotropic conductive film (ACF) interposed therebetween. As shown in FIG. 2, on a surface of the drive IC 34 on the sealing plate 33 side, the multiple power supply terminals 56 connected to the power supply wires 53 and the multiple individual terminals 57 connected to the individual connection terminals 54 are arranged side by side in the nozzle row direction. Each of the individual terminals 57 is a terminal that outputs an individual signal for the corresponding one of the piezoelectric elements 32. The individual terminals 57 of this embodiment are formed in two rows on both sides of the power supply terminals 56 so as to correspond to the rows of the piezoelectric elements 32, which are arranged side by side in two rows. In the rows of the individual terminals 57, a distance (i.e., pitch) between centers of every adjacent two of the individual terminals 57 is set as small as possible. In this embodiment, this pitch is set to be smaller than the pitch of the bump electrodes 40. This enables size reduction of the drive IC 34.

In the recording head 3 formed as described above, the ink from the ink cartridge 7 is introduced to the pressure chambers 30 through the ink introducing paths, the reservoirs 18, the common liquid chambers 25, and the individual communicating paths 26. In this state, drive signals from the drive IC 34 are supplied to the piezo-electric elements 32 through the wires formed on and in the sealing plate 33 to drive the piezoelectric elements 32 and cause changes in pressure in the pressure chambers 30. By utilizing the changes in pressure, the recording head 3 jets ink droplets from the nozzles 22 through the nozzle communicating paths 27.

Next, the wiring groups that connect the individual connection terminals 54 to the bump electrodes 40 formed on the sealing plate 33, especially, the positional relationship among the individual connection terminals 54, the upper surface-side wires 46, the penetrating wires 45, the lower surface-side wires 47, and the bump electrodes 40 are described in detail. Note that the following description is given with a focus being put on the wiring group on one side corresponding to the region A among the wiring groups corresponding to the individual electrodes formed on both end sides of the sealing plate 33. FIG. 4 is a plan view viewed from the second surface 42 (upper surface) side of the sealing plate 33.

As shown in FIG. 4, the individual connection terminals 54 and the bump electrodes 40 are arranged at regular intervals in the nozzle row direction (first direction). In this embodiment, a pitch P1 of the individual connection terminals 54 is set to be smaller than a pitch P2 of the bump electrodes 40. In addition, the individual connection terminals 54 and the bump electrodes 40 are arranged with a space provided therebetween in the direction (second direction) perpendicular to the nozzle row direction. The wires that connect the individual connection terminals 54 to the bump electrodes 40 each include: the upper surface-side wire 46 formed on the second surface 42 to extend from the individual connection terminal 54 in the direction perpendicular to the nozzle row direction on the side opposite from the bump electrodes 40; the penetrating wire 45 formed on an end portion of the upper surface-side wire 46 on the side opposite from the individual connection terminal 54; and the lower surface-side wire 47 located on the first surface 41 to connect the penetrating wire 45 to the corresponding one of the bump electrodes 40. In this manner, the penetrating wires 45 are formed at positions away from the individual connection terminals 54 in the direction perpendicular to the nozzle row direction.

In this embodiment, a distance Ph in the nozzle row direction between centers of each two of the through holes 45a (i.e., the penetrating wires 45) adjacent in the nozzle row direction is equal to the pitch P1 of the individual connection terminals 54. In addition, the pitch change between the penetrating wires 45 (the individual connection terminals 54) and the bump electrodes 40 is achieved by the lower surface-side wires 47 on the first surface 41. In other words, on one side, a pitch of end portions of the lower surface-side wires 47 provided between the penetrating wires 45 and the bump electrodes 40 is set to be equal to the distance Ph in the nozzle row direction between the centers of the penetrating wires 45, whereas, on the other side, a pitch of end portions of the lower surface-side wires 47 is set to be equal to the pitch P2 of the bump electrodes 40.

Here, each two of the penetrating wires 45 adjacent in the nozzle row direction are arranged at different positions in the direction perpendicular to the nozzle row direction. In this embodiment, the penetrating wires 45 formed closer to one side (the individual connection terminal 54 side) and the penetrating wires 45 formed closer to the other side (the side opposite from the individual connection terminal 54) are arranged alternately in the nozzle row direction. In other words, for a single row of the individual connection terminals 54, two rows of the penetrating wires 45 extending in the nozzle row direction are formed. Note that, the inner diameters of the through holes 45a of the penetrating wires 45 are set to be the same.

Since each two of the penetrating wires 45 adjacent in the nozzle row direction are arranged at different positions in the direction perpendicular to the nozzle row direction as described above, the through holes 45a can have larger diameters (larger hole diameters). This makes it possible to lower the ratio (so-called aspect ratio) of the plate thickness of the sealing plate 33 to the diameter of each of the through holes 45a, without changing the plate thickness of the sealing plate 33. Hence, the conductor portions 45b can be formed easily in the through holes 45a by a method such as an electrolytic plating method. Consequently, the electronic device 14 can be manufactured at low costs.

In addition, in this embodiment, a distance between the centers of each two of the through holes 45a adjacent in the nozzle row direction is larger than a sum of radii of the two through holes 45a. Specifically, when the radius of one of each two of the through holes 45a adjacent in the nozzle row direction closer to one side is represented by r1, the radius of the penetrating wire 45 closer to the other side is represented by r2, and the distance between the centers of these through holes 45a is represented by d, the through holes 45a are configured to satisfy the following formula (1):

$$r1+r2<d \tag{1}.$$

This makes it possible to more surely suppress the short circuit between each two of the penetrating wires 45 adjacent in the nozzle row direction. In addition, a certain distance can be surely provided between each two of the through holes 45a adjacent in the nozzle row direction, so that the decrease in strength of the sealing plate 33 can be suppressed.

Moreover, the distance Ph in the nozzle row direction between the centers of each two of the through holes 45a adjacent in the nozzle row direction is smaller than the sum of the radii of the two through holes 45a. Specifically, the through holes 45a are formed to satisfy the following formula (2):

$$r1+r2>Ph \tag{2}.$$

This makes it possible to reduce the pitch P1 of the individual connection terminals 54 connected to the penetrating wires 45 by the upper surface-side wires 46. Consequently, the sealing plate 33 and the drive IC 34 can be reduced in size, and, in turn, size reduction of the electronic device 14 can be achieved.

In the description above, the focus is put on the wiring group on the one side corresponding to the region A out of the wiring groups formed on both the end sides of the sealing plate 33. It should be noted that the wiring group on the other side is formed in the same manner. In this embodiment, the wiring groups on both the end sides are provided symmetrically with respect to an imaginary straight line extending in the nozzle row direction.

Next, a method for manufacturing the above-described recording head 3, especially, the electronic device 14 is described. The electronic device 14 of this embodiment is obtained as follows. Specifically, a single crystal silicon substrate (silicon wafer) in which multiple regions each serving as the sealing plate 33 are formed is joined to a single crystal silicon substrate (silicon wafer) in which multiple regions each serving as the pressure chamber-forming plate 29 including the vibration plate 31 and the piezo-electric elements 32 stacked thereon are formed. Then, the drive IC 34 is joined at each of the corresponding positions. After that, the stack is broken into pieces.

More specifically, the single crystal silicon substrate including the sealing plates 33 is, first, subjected to a photolithography step and an etching step to form recessed portions, which are used to form the upper surface-side embedded wires 50 and the lower surface-side embedded wires 51, on both surfaces of the single crystal silicon substrate. Specifically, the single crystal silicon substrate is subjected to patterning using a photoresist and then dry etching to form the recessed portions. Next, the through holes 45a are formed by a photolithography step and an etching step. Specifically, after patterning using a photoresist, portions of the surfaces of the single crystal silicon substrate in which the through holes 45a are to be formed are exposed. Subsequently, holes with desired depths are formed by dry etching in the exposed portions. After that, the photoresist is detached, and an insulation film is formed on a sidewall of each of the through holes 45a. Note that, as a method for forming the insulation film, various methods can be employed such as a CVD method, a method in which a silicon oxide film is formed by thermal oxidation, and a method in which a resin is applied and then cured. In this embodiment, since each two of the penetrating wires 45 adjacent in the nozzle row direction are arranged at the different positions, the through holes 45a can be formed as large as possible.

Subsequently, an electrode member to be the upper surface-side embedded wires 50, the lower surface-side embedded wire 51, and the conductor portions 45b of the penetrating wires 45 is formed on the both surfaces of the single crystal silicon substrate and in the through holes 45a by an electrolytic plating method. Specifically, a seed layer for forming the electrode member is formed, and the electrode member is formed by electrolytic copper plating using the seed layer as an electrode. Note that it is preferable to form a film that improves the adhesion to the substrate and barrier properties under each of the seed layers. In addition, the seed layer is preferably a layer of copper (Cu) formed by employing a sputtering method or a CVD method, and the adhesion film or the barrier film is preferably a film of titanium (Ti), titanium nitride (TiN), titanium tungsten (TiW), tantalum (Ta), tantalum nitride (TaN), or the like formed by employing a sputtering method or a CVD method. Moreover, the method for forming the electrode member does not necessarily have to be based on the electrolytic copper plating, but the electrode member may be formed by embedding a material capable of providing electrical conduction in the vertical direction in the recessed portions and the through holes 45a by a method such as electroless plating or printing using a conductive paste. By any of the methods, the electrode member can be formed easily in the through holes 45a, because the through holes 45a can be formed larger.

Next, the copper (Cu) deposited on the upper surface of the single crystal silicon substrate is removed by employing a CMP (chemical mechanical polishing) method to expose the surface of the single crystal silicon substrate. In addition, the lower surface of the single crystal silicon substrate is removed to a predetermined thickness by a back grinding method or the like, and finally the single crystal silicon substrate is ground by employing a CMP method or the like to expose the conductor portions 45b of the penetrating wires 45. In this manner, the upper surface-side embedded wires 50, the lower surface-side embedded wires 51, and the penetrating wires 45 are formed in the single crystal silicon substrate. After these wires 50, 51, and 45 are formed, an insulation film such as a silicon oxide film is formed on the lower surface of the single crystal silicon substrate. Then, after patterning using a photoresist, the lower surface-side embedded wires 51 and the penetrating wires 45 are exposed by dry etching or wet etching, and then the photoresist is detached. After that, a resin film is formed on the lower surface of the single crystal silicon substrate, and the inner resins 40a are formed by a photolithography step and an etching step. Then, the inner resins 40a are melted by heating to round corners of the inner resins 40a. At last, the upper surface-side wires 46 and the lower surface-side wires 47 serving as rewires are formed on both surfaces of the substrate. Specifically, a rewiring layer is formed on the entire surface of the single crystal silicon substrate on one side, and the rewiring layer is patterned by a photolithography step and an etching step. In this manner, a pattern of the upper surface-side wires 46 or the lower surface-side wires 47 is formed. Simultaneously with the formation of the lower surface-side wires 47, the bump electrodes 40 are also formed. In this manner, multiple regions each of which is to be the sealing plate 33 corresponding to the recording head 3 are formed in the single crystal silicon substrate. Note that, regarding materials of the rewiring layer, a topmost surface of the rewiring layer is preferably formed of gold (Au). However, the material of the rewiring layer is not limited thereto, but the rewiring layer may be formed by using any generally used material (such as Ti, Al, Cr, Ni, or Cu). In addition, the method for forming the upper surface-side wires 46, the lower surface-side wire 47, and the penetrating wires 45 in each sealing plate 33 is not limited to the above-described methods, but it is also possible to form them by any generally employable manufacturing method.

On the other hand, regarding the single crystal silicon substrate including the pressure chamber-forming plates 29, first, the vibration plate 31 is stacked on a surface (a surface on a side facing the sealing plate 33) of the single crystal silicon substrate. Next, by a semiconductor process, the lower electrode layers 37, the piezoelectric layers 38, the upper electrode layer 39, and the like are sequentially patterned to form the piezoelectric elements 32. In this manner, multiple regions each of which is to be the pressure chamber-forming plate 29 corresponding to the recording head 3 are formed in the single crystal silicon substrate. Then, after the sealing plates 33 and the pressure chamber-forming plates 29 are formed in these single crystal silicon substrates, a photosensitive adhesive layer is formed on a surface (a surface on the sealing plate 33 side) of the single crystal silicon substrate including the pressure chamber-forming plates 29. Then, pieces of the photosensitive adhesive agent 43 are formed in predetermined positions by a photolithography step. Specifically, a liquid photosensitive adhesive agent having photosensitivity and thermosetting properties is applied onto the vibration plate 31 by using a spin coater or the like, followed by heating. In this manner, the photosensitive adhesive layer is formed. By subsequent exposure and development, the shapes of the photosensitive adhesive agent 43 are patterned at the predetermined positions.

After the pieces of the photosensitive adhesive agent 43 are formed, the two single crystal silicon substrates are joined. Specifically, one of the single crystal silicon substrates is moved toward and relative to the other one of the single crystal silicon substrates and bonded to each other, with the photosensitive adhesive agent 43 interposed between the two single crystal silicon substrates. In this state, a pressure is applied to the two single crystal silicon substrates in the vertical direction against the elastic restoring force of the bump electrodes 40. As a result, the bump electrodes 40 are compressed, and are surely electrically connected to the lower electrode layers 37, the upper electrode layer 39, and the like on the pressure chamber-forming plate 29. Then, the substrates are heated under pressure to a curing temperature of the photo-sensitive adhesive agent 43. Consequently, the photosensitive adhesive agent 43 is cured, and the two single crystal silicon substrates are joined, with the bump electrodes 40 being compressed.

After the two single crystal silicon substrates are joined, the single crystal silicon substrate including the pressure chamber-forming plates 29 is polished from the lower surface side (the side opposite from the single crystal silicon substrate including the sealing plates 33) to thin the single crystal silicon substrate including the pressure chamber-forming plates 29. After that, the pressure chambers 30 are formed in the thinned single crystal silicon substrate including the pressure chamber-forming plates 29 by a photolithography step and an etching step. Then, the drive IC 34 is joined to the upper surface of the single crystal silicon substrate including the sealing plates 33 by using the adhesive agent 59. Finally, the stack is broken into individual electronic devices 14 along predetermined scribe lines. Note that, in the above-described method, the electronic devices 14 are fabricated by joining the two single crystal silicon substrates to each other and then cutting the substrates into the pieces. However, the invention is not limited thereto. For example, it is also possible to cut each of the two single crystal silicon substrates into pieces of the sealing plates 33 or the pressure chamber-forming plates 29, and then join the sealing plates 33 and the pressure chamber-forming plates 29 to each other. Moreover, it is also possible to cut each of the single crystal silicon substrates into pieces and then form the sealing plates 33 and the pressure chamber-forming plates 29 in the pieces of the substrates.

Then, each of the electronic devices 14 manufactured by the above-described process is positioned with respect to and fixed to the flow path unit 15 (communicating plate 24) by using an adhesive agent or the like. Then, with the electronic device 14 housed in the housing space 17 of the head case 16, the head case 16 and the flow path unit 15 are joined to each other. In this manner, the above-described recording head 3 is manufactured.

In the above-described first embodiment, the penetrating wires 45 are formed inside the individual connection terminals 54 (on the side opposite from the bump electrodes 40), and the pitch change is achieved on the first surface 41 side. However, the invention is not limited to this configuration. In a second embodiment shown in FIG. 5, penetrating wires 45' are formed outside the individual connection terminals 54 (on the bump electrode 40 side) and further outside the bump electrodes 40. Note that FIG. 5 is a plan view of a sealing plate 33 of the second embodiment.

More specific description is as follows. As shown in FIG. 5, upper surface-side wires 46' are formed on the second surface 42 to extend from the individual connection terminals 54 to positions overlapped with the bump electrodes 40. From the positions, the upper surface-side wires 46' extend in the direction perpendicular to the nozzle row direction. In other words, the pitch change is achieved by the upper surface-side wires 46'. In addition, each adjacent two of the upper surface-side wires 46' are formed to be different in distance between the position overlapped with the bump electrode 40 and the position overlapped with the penetrating wire. In other words, each two of the penetrating wires 45' adjacent in the nozzle row direction are arranged at different positions in the direction perpendicular to the nozzle row direction. In this embodiment, for a single row of the bump electrodes 40, the penetrating wires 45' are formed in three rows extending in the nozzle row direction. Specifically, the penetrating wires 45' formed closer to one side (on the bump electrode 40 side), the penetrating wires 45' formed closer to the other side (on a side opposite from the bump electrode 40 side), and the penetrating wires 45' formed at a position between these sides are arranged adjacent to one another in the nozzle row direction. On the second surface 41 side, the lower surface-side wires 47' are formed to extend from the penetrating wires 45' in the direction perpendicular to the nozzle row direction, and are connected to the bump electrodes 40. Note that, in this embodiment, a distance Ph' in the nozzle row direction between centers of each two of the through holes 45a' (the penetrating wires 45) adjacent in the nozzle row direction is set to be equal to the pitch P2 of the bump electrodes 40.

As described above, each two of the penetrating wires 45' adjacent in the nozzle row direction are arranged at different positions in the direction perpendicular to the nozzle row direction also in this embodiment. Hence, the through holes 45a' can have larger diameters (larger hole diameters). This makes it possible to lower the ratio (so-called aspect ratio) of the plate thickness of the sealing plate 33 to the diameter of each of the through holes 45a' without changing the plate thickness of the sealing plate 33. Hence, the conductor portions 45b' can be formed easily in the through holes 45a' by a method such as an electrolytic plating method. Consequently, the electronic device 14 can be manufactured at low costs. In this embodiment, especially, the penetrating wires 45' are arranged on the bump electrode 40 side, the bump electrode 40 being formed with a pitch larger than the pitch P1 of the individual connection terminals 54. In addition, the pitch P2 of the bump electrodes 40 is set to be equal to the distance Ph' in the nozzle row direction between the centers of the penetrating wires 45'. Hence, the diameters (hole diameters) of the through holes 45a' can be increased further.

In addition, the distance between the centers of each two of the through hole 45a' adjacent in the nozzle row direction is larger than the sum of the radii of the two through holes 45a' also in this embodiment. Moreover, the distance Ph' in the nozzle row direction between the centers of each two of the through holes 45a' adjacent in the nozzle row direction is smaller than the sum of the radii of the two through holes 45a'. In other words, a radius r1' of the penetrating wire 45' in one of each two of the through holes 45a' adjacent in the nozzle row direction, a radius r2' of the penetrating wire 45 in the other one of the through holes 45a', a distance d' between the centers of these through holes 45a', and the distance Ph' in the nozzle row direction between the centers of the penetrating wires 45' satisfy the following formulae (3) and (4):

$$r1'+r2'<d' \qquad (3), \text{ and}$$

$$r1'+r2'>Ph' \qquad (4).$$

Note that descriptions of the other constituents, which are the same as those in the above-described first embodiment, are omitted. In addition, in the description above, the embodiments in which the penetrating wires 45 are formed in two rows or three rows extending the nozzle row direction is shown as examples. However, the invention is not limited thereto. The penetrating wires may be formed in more rows extending in the nozzle row direction.

Further, in a third embodiment shown in FIG. 6, some penetrating wires 45" are formed inside the individual connection terminals 54 and other penetrating wires 45" are formed outside the bump electrodes 40. The some penetrating wires 45" are separated from the other penetrating wires 45". Note that FIG. 6A is a plan view of a sealing plate in the third embodiment, and FIG. 6B is a perspective view for describing structures of wiring groups. Note that the sealing plate 33 is transparent in FIG. 6B. In addition, for simplification, the bump electrodes 40 in FIG. 6B are depicted as cuboids on the lower surface-side wire 47". Actually, however, the bump electrodes 40 are formed by stacking the lower surface-side wires 47" on the inner resins 40a as described above.

The penetrating wires 45" of this embodiment are arranged alternately in regions separated by an imaginary straight line L on the second surface 42 and in parallel to the nozzle row direction, namely, a first region a1, which is a region where the individual connection terminal 54 are formed, and a second region a2, which is a region overlapped with the bump electrodes 40. Specifically, wiring groups that connect the individual connection terminals 54 to the bump electrodes 40 include first wires 61 whose penetrating wires 45" are positioned in the first regions a1, and second wires 62 whose penetrating wires 45" are positioned in the second region a2. More specific description is as follows. Each of the first wires 61 includes an upper surface-side wire 46" formed on the second surface 42 to extend in the direction perpendicular to the nozzle row from the individual connection terminal 54 to the side opposite from the bump electrode 40, a penetrating wire 45" formed in the first region a1, and a lower surface-side wire 47" providing connection from the penetrating wire 45" to the corresponding bump electrode 40 on the first surface 41. Meanwhile, each of the second wires 62 includes an upper surface-side wire 46" formed on the second surface 42 to extend from the individual connection terminal 54 to the corresponding bump electrode 40, a penetrating wire 45" formed in the second region a2 and at a position more away from the individual connection terminal 54 than from the bump electrode 40, and a lower surface-side wire 47" formed on the first surface 41 to extend in the direction perpendicular to the nozzle row from the penetrating wire 45" to the corresponding bump electrode 40. In addition, the first wires 61 and the second wires 62 are arranged adjacent to each other in the nozzle row direction. In other words, the first wires 61 and the second wires 62 are arranged alternately in the nozzle row direction. Note that descriptions of the other constituents, which are the same as those in the above-described first embodiment, are omitted.

In this embodiment, the penetrating wires 45 of a first wiring group including the multiple first wires 61 are provided in the first region a1 on the individual connection terminal 54 side as described above. Hence, the pitch change can be achieved on the first surface 41 side by the lower surface-side wires 47. On the other hand, the penetrating wires 45 of a second wiring group including the multiple second wires 62 are provided in the second region a2 on the bump electrode 40 side. Hence, the pitch change can be achieved on the second surface 42 side by the upper surface-side wires 46. In other words, since the pitch change by the wiring groups can be conducted separately on both surfaces of the wiring plate, the distances between the bump electrodes 40 and the distances between the individual connection terminals 54 can be reduced, while sufficient wiring distances and sufficient wiring widths (the distances between the upper surface-side wires 46", the width of the upper surface-side wires 46", the distances between the lower surface-side wires 47", and the width of the lower surface-side wires 47") are surely provided. Consequently, while preventing a break and a short circuit of the first wires 61 and the second wires 62, the sealing plate 33 can be reduced in size, and in turn size reduction of the electronic device 14 can be achieved.

In addition, in each of the above-described embodiments, the individual connection terminals 54 and the bump electrodes 40 are arranged at regular intervals in the nozzle row direction (first direction). However, the invention is not limited to this configuration. The invention can also be applied to individual connection terminals and bump electrodes which are not arranged at regular intervals in the nozzle row direction. The point is that the individual connection terminals and the bump electrodes should be arranged with spaces provided therebetween. Moreover, in each of the above-described embodiments, the bump electrodes 40 are provided on the sealing plate 33 side. However, the invention is not limited to this configuration. For example, the bump electrodes may be provided on the pressure chamber plate side. In this case, terminals on the sealing plate side facing the bump electrodes serve as the first terminals according to the invention. In addition, in each of the above-described embodiments, each of the bump electrodes 40 includes the inner resin 40a and the conductive film 40b. However, the invention is not limited to this configuration. For example, the bump electrodes can be formed of a metal such as gold (Au) or solder. Moreover, in each of the above-described embodiments, the pitch P1 of the individual connection terminals 54 is set to be smaller than the pitch P2 of the bump electrodes 40. However, the invention is not limited to this configuration. For example, it is also possible to make the pitch of the individual connection terminals larger than the pitch of the bump electrodes. Alternatively, it is also possible to conduct no pitch change by making the pitch of the individual connection terminals equal to the pitch of the bump electrodes. In addition, in the above-described manufacturing method, the photo-sensitive adhesive agent 43 is applied onto the single crystal silicon substrate including the pressure chamber-forming plates 29. However, the invention is not limited to this configuration. For example, it is also possible to apply the photosensitive adhesive agent onto the single crystal silicon substrate including the sealing plates.

In addition, in the description above, the inkjet-type recording head to be mounted on an inkjet printer is shown as an example of liquid jetting head. However, the invention can also be applied to devices that jet a liquid other than ink. For example, the invention can be also applied to coloring material jetting heads used for manufacturing color filters of liquid crystal displays and the like, electrode material jetting heads used for forming electrodes of organic EL (Electro Luminescence) displays, FEDs (surface emission displays), and the like, bioorganic matter jetting heads used for manufacturing biochips (biochemical elements), and the like.

Moreover, the invention is not limited to electronic devices used as actuators in liquid jetting heads, but the invention can also be applied to, for example, electronic devices used for various sensors and the like, etc.

REFERENCE SIGNS LIST 1 printer, 3 recording head, 14 electronic device, 15 flow path unit, 16 head case, 17 housing space, 18 reservoir, 21 nozzle plate, 22 nozzle, 24 communicating plate, 25 common liquid chamber, 26 individual communicating path, 29 pressure chamber-forming plate, 30 pressure chamber, 31 vibration plate, 32 piezoelectric element, 33 sealing plate, 37 lower electrode layer, 38 piezoelectric layer, 39 upper electrode layer, 40 bump electrode, 41 first surface, 42 second surface, 43 photosensitive adhesive agent, 45 penetrating wire, 46 upper surface-side wire, 47 lower surface-side wire, 50 upper surface-side embedded wire, 51 lower surface-side embedded wire, 53 power supply wire, 54 individual connection terminal, 56 power supply terminal, 57 individual terminal, 59 adhesive agent

CITATION LIST

Patent Literature

[PTL 1] JP-A-2012-51253

The invention claimed is:

1. An electronic device comprising:
a wiring plate having a first surface to which a driving element-forming plate including a plurality of driving elements is connected and a second surface which is on a side opposite from the first surface and on which a drive IC that outputs signals for driving the driving elements is provided to be stacked over the plurality of driving elements;
a plurality of first terminals which are arranged in a first direction on the first surface of the wiring plate; and
a plurality of second terminals which are arranged in the first direction on the second surface of the wiring plate, wherein
wires each of which connects one of the first terminals to one of the second terminals corresponding to the first terminal each include a penetrating wire formed inside a through hole penetrating the wiring plate, each of the penetrating wires is formed at a position away from the first terminal or the second terminal in a second direction perpendicular to the first direction, and
each two of the penetrating wires adjacent in the first direction are arranged at different positions in the second direction.

2. The electronic device according to claim 1, wherein a distance between centers of each two of the through holes adjacent in the first direction is larger than a sum of radii of the two through holes.

3. The electronic device according to claim 2, wherein a distance in the first direction between the centers of the two through holes adjacent in the first direction is smaller than the sum of the radii of the two through holes.

4. A liquid jet head comprising the electronic device according to claim 1.

5. A liquid jet device comprising the liquid jet head according to claim 4.

* * * * *